United States Patent
Hayashi (10) Patent No.: US 8,866,155 B2
(45) Date of Patent: Oct. 21, 2014

(54) SILICON CARBIDE SEMICONDUCTOR DEVICE

(71) Applicant: Sumitomo Electric Industries, Ltd., Osaka (JP)

(72) Inventor: Hideki Hayashi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/895,036

(22) Filed: May 15, 2013

(65) Prior Publication Data

US 2013/0341645 A1 Dec. 26, 2013

Related U.S. Application Data

(60) Provisional application No. 61/664,610, filed on Jun. 26, 2012.

(30) Foreign Application Priority Data

Jun. 26, 2012 (JP) ................................. 2012-142830

(51) Int. Cl.
| H01L 29/15 | (2006.01) |
| H01L 29/16 | (2006.01) |
| H01L 29/739 | (2006.01) |
| H01L 29/06 | (2006.01) |
| H01L 29/66 | (2006.01) |

(52) U.S. Cl.
CPC ........ *H01L 29/1608* (2013.01); *H01L 29/7393* (2013.01); *H01L 29/0696* (2013.01); *H01L 29/66348* (2013.01); *H01L 29/7397* (2013.01)

USPC ............... 257/77; 257/E21.054; 257/E21.065

(58) Field of Classification Search
USPC .............................. 257/77, E21.054, E21.065
See application file for complete search history.

(56) References Cited

U.S. PATENT DOCUMENTS

| 7,723,751 B2 * | 5/2010 | Kawasaki et al. .............. 257/194 |
| 2004/0079989 A1 * | 4/2004 | Kaneko et al. ................. 257/328 |
| 2011/0018004 A1 | 1/2011 | Shimizu et al. |

FOREIGN PATENT DOCUMENTS

| JP | 07-30111 | 1/1995 |
| JP | 2002-359378 | 12/2002 |
| JP | 2003-069038 | 3/2003 |
| JP | 2011-023675 A | 2/2011 |

OTHER PUBLICATIONS

B.J. Baliga et al., "The insulated gate rectifier (IGR): A new power switching device," IEDM Tech. Dig., 1982, pp. 264-267.
Yasunori Tanaka et al., "700-V 1.0-mΩ • $cm^2$ Buried Gate SiC-SIT (SiC-BGSIT)", IEEE Electron Device Letters, vol. 27, No. 11, 2006, pp. 908-910.
International Search Report and Written Opinion in PCT International Application No. PCT/JP2013/061919, dated Jul. 16, 2013.

* cited by examiner

*Primary Examiner* — Timor Karimy
(74) *Attorney, Agent, or Firm* — Venable LLP; Michael A. Sartori; George L. Howarah (57) ABSTRACT

A collector layer is made of silicon carbide having a first conductivity type. A switching element is provided on the collector layer. The switching element includes a junction gate for controlling a channel having a second conductivity type different from the first conductivity type.

5 Claims, 7 Drawing Sheets

SILICON CARBIDE SEMICONDUCTOR DEVICE

BACKGROUND OF THE INVENTION

1. Field of the Invention

The present invention relates to a silicon carbide semiconductor device, and in particular to a silicon carbide semiconductor device having a junction gate.

2. Description of the Background Art

As a power semiconductor device, for example, a MOSFET (Metal Oxide Semiconductor Field Effect Transistor) and an IGBT (Insulated Gate Bipolar Transistor) have been widely used (see, for example, B. J. Baliga et al., "The insulated gate rectifier (IGR): A new power switching device," IEDM Tech. Dig., 1982, pp. 264 to 267). An IGBT has a configuration combining a MOSFET and a bipolar transistor, and thereby has a high-speed operation as in a MOSFET and a low ON resistance and a high breakdown voltage as in a bipolar device.

As a material for power semiconductor devices, silicon (Si) has been conventionally widely used. It is expected that performance such as ON resistance will be significantly improved by using silicon carbide (SiC) having a larger band gap instead of Si.

Thus, it is expected that a power semiconductor device having a lower ON resistance and a higher breakdown voltage than before can be obtained by using an IGBT instead of a MOSFET, and using SiC instead of Si as a material. However, an IGBT using SiC has not been industrially put into practical use, partly because, when SiC is used, channel mobility in a MOS structure included in the IGBT is significantly lower than a theoretical value, which results in a higher ON resistance. Therefore, a method for improving channel mobility in a MOS structure using SiC has been under consideration (see, for example, Japanese Patent Laying-Open No. 2011-023675).

However, even with the method described in the above publication, it is considered difficult to obtain channel mobility sufficiently close to a theoretical value. Thus, it is considered still impossible to obtain a low ON resistance and a high breakdown voltage which are theoretically expected when SiC is used instead of Si and an IGBT is used instead of a MOSFET.

SUMMARY OF THE INVENTION

The present invention has been made to solve the aforementioned problem, and one object of the present invention is to provide a silicon carbide semiconductor device capable of performing a high-speed operation and having a low ON resistance and a high breakdown voltage.

A silicon carbide semiconductor device in accordance with the present invention has a collector layer and a switching element. The collector layer is made of silicon carbide having a first conductivity type. The switching element is provided on the collector layer. The switching element includes a junction gate for controlling a channel having a second conductivity type different from the first conductivity type.

According to the silicon carbide semiconductor device, a high-speed operation can be performed by including the switching element having the second conductivity type, that is, a unipolar element. Further, since the junction gate is used instead of an insulating gate in the switching element, channel mobility close to theoretical channel mobility of SiC can be readily utilized. Thereby, ON resistance of the switching element can be readily reduced to a certain degree. To the switching element having the second conductivity type as described above, the collector layer having the first conductivity type is added. That is, the switching element as a unipolar element is combined with a bipolar transistor. Thereby, a silicon carbide semiconductor device capable of performing a high-speed operation and having a low ON resistance and a high breakdown voltage can be obtained.

Preferably, the second conductivity type is n type. Thereby, ON resistance of the silicon carbide semiconductor device can be further reduced.

Preferably, the switching element includes a semiconductor layer, a channel layer, a gate layer, and a gate electrode. The semiconductor layer has a first layer, a second layer, and a third layer. The first layer is provided on the collector layer and has the second conductivity type. The second layer is provided on the first layer and has the first conductivity type. The third layer is provided on the second layer and has the second conductivity type. The semiconductor layer is provided with a trench. The trench has a side wall penetrating the third layer and the second layer and reaching the first layer. The channel layer contacts each of the first to third layers on the side wall of the trench, and has the second conductivity type. The gate layer serves as the junction gate, sandwiches the channel layer between itself and the second layer, and has the first conductivity type. The gate electrode is provided on the gate layer. Thereby, the switching element can have a configuration easy to manufacture.

Preferably, the trench has a tapered shape. Thereby, the channel layer can be readily formed on the side wall of the trench.

Preferably, the silicon carbide semiconductor device has an emitter electrode connected to at least one of the third layer and the channel layer and separated from the gate layer. Thereby, carriers can be supplied from the emitter electrode into the switching element.

Preferably, the emitter electrode is connected to the second layer. Thereby, a potential of the second layer can correspond to a potential of the emitter electrode.

As described above, according to the present invention, a silicon carbide semiconductor device capable of performing a high-speed operation and having a low ON resistance and a high breakdown voltage can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings. In the drawings below, identical or corresponding parts will be designated by the same reference numerals, and the description thereof will not be repeated.

Embodiment 1

Figure 1:
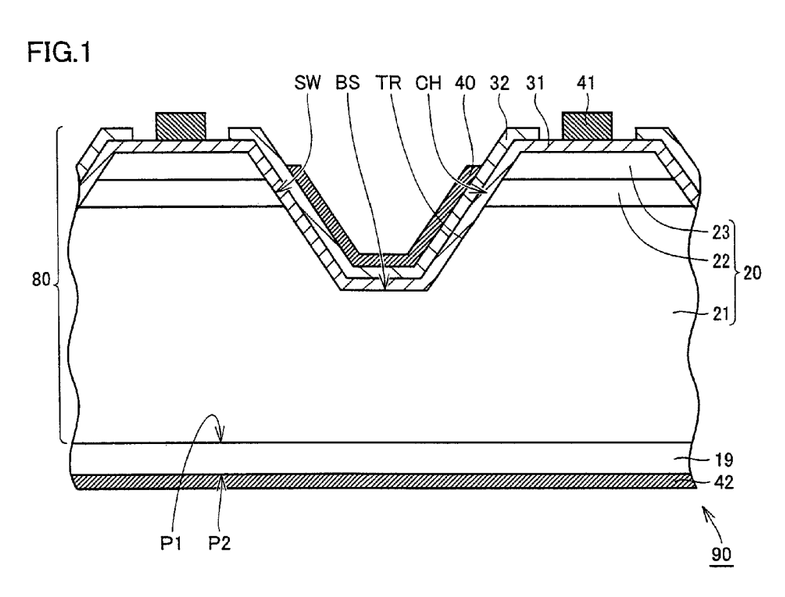
FIG. 1 is a view schematically showing a configuration of a silicon carbide semiconductor device in Embodiment 1 of the present invention, which is a cross sectional view along a cross section corresponding to a line I-I in each of FIGS. 2 and 3.
Figure 2:
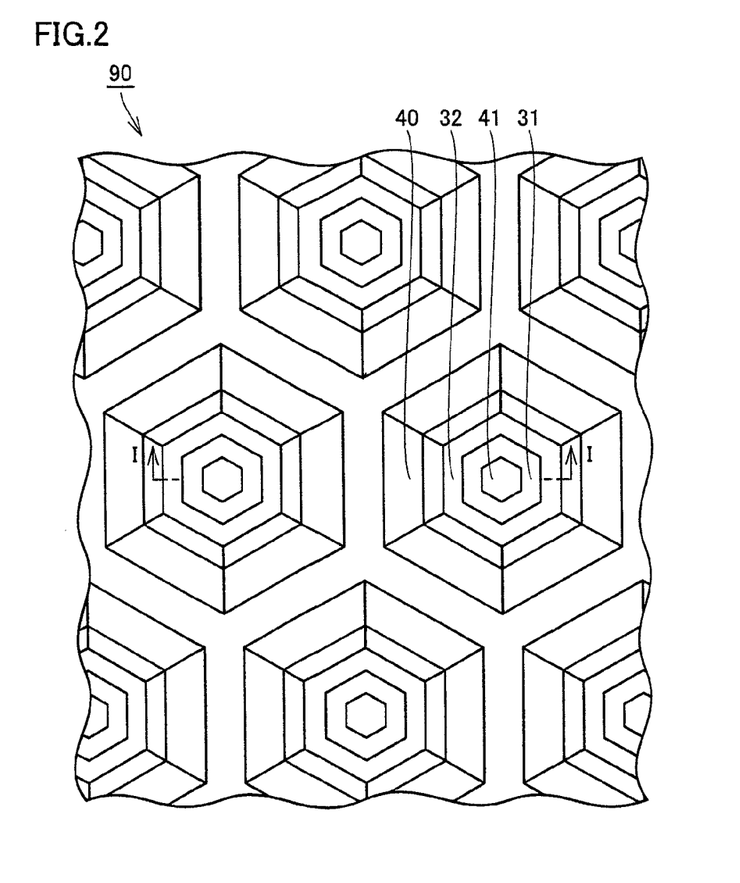
FIG. 2 is a plan view schematically showing a structure of the silicon carbide semiconductor device of FIG. 1.
Figure 3:
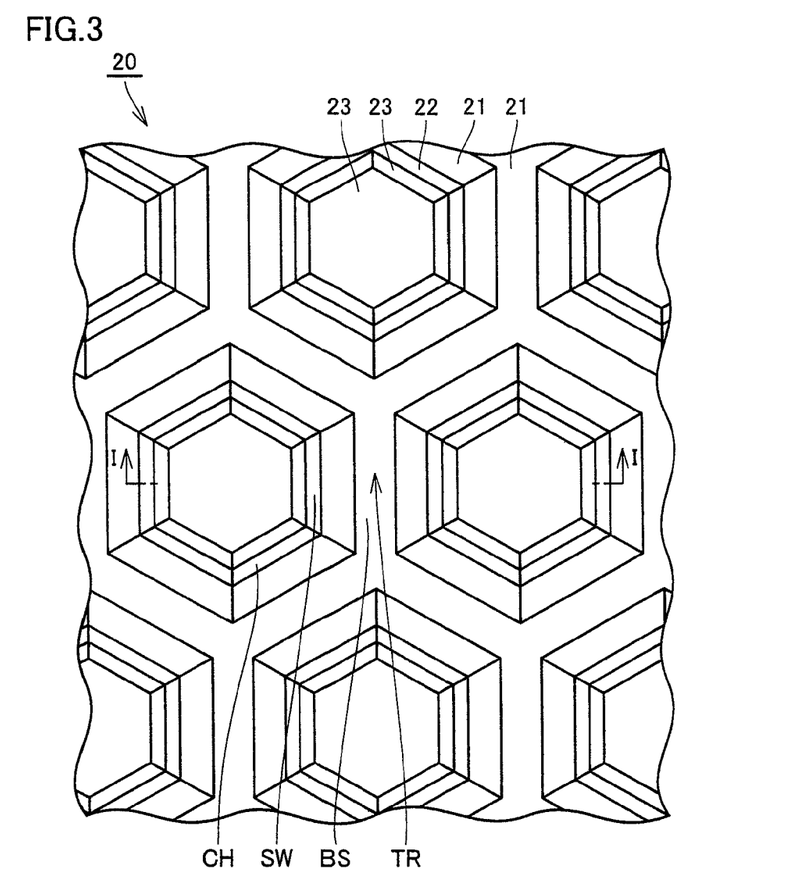
FIG. 3 is a plan view schematically showing a structure of a semiconductor layer of the silicon carbide semiconductor device of FIG. 1.

As shown in FIGS. 1 to 3, a semiconductor device 90 (silicon carbide semiconductor device) in the present embodiment has a collector layer 19, a switching element 80, an emitter electrode 41, and a collector electrode 42. Collector layer 19 is made of SiC having p type (a first conductivity type), and preferably has a hexagonal crystal structure. Collector layer 19 has an upper surface P1 and a back surface P2 opposite to upper surface P1.

Switching element 80 is provided on upper surface P1 of collector layer 19. Switching element 80 includes a junction gate for controlling a channel CH having n type (a second conductivity type different from the first conductivity type). That is, switching element 80 includes a JFET (Junction Field Effect Transistor), which is a type of unipolar element. Switching element 80 includes a semiconductor layer 20, a channel layer 31, a gate layer 32 (junction gate), and a gate electrode 40.

Semiconductor layer 20 is made of SiC, and preferably has a hexagonal crystal structure. Semiconductor layer 20 has a first layer 21, a second layer 22, and a third layer 23. First layer 21 is provided on upper surface P1 of collector layer 19 and has n type (the second conductivity type). Second layer 22 is provided on first layer 21 and has p type (the first conductivity type). Third layer 23 is provided on second layer 22 and has n type (the second conductivity type).

Semiconductor layer 20 is provided with a trench TR in its upper surface (i.e., a surface opposite to a surface provided with collector layer 19). Trench TR has side walls SW and a bottom surface BS. Side wall SW penetrates third layer 23 and second layer 22 and reaches first layer 21. Preferably, trench TR has a tapered shape. That is, side wall SW of trench TR is inclined with respect to upper surface P1 at an angle of more than 0° and less than a right angle. More preferably, side wall SW is inclined with respect to upper surface P1 at an angle of not less than 10°.

Channel layer 31 is made of SiC and has n type (the second conductivity type). Preferably, channel layer 31 has a hexagonal crystal structure. Channel layer 31 contacts each of first to third layers 21 to 23 on side wall SW of trench TR. Channel layer 31 may be provided not only on side wall SW but also on bottom surface BS, as shown in FIG. 1. Preferably, channel layer 31 on side wall SW has a thickness of not less than 50 nm and not more than 500 nm.

Gate layer 32 is made of SiC and has p type (the first conductivity type). Preferably, gate layer 32 has a hexagonal crystal structure. Gate layer 32 serves as the junction gate, and sandwiches channel layer 31 between itself and second layer 22. Gate electrode 40 is provided on gate layer 32.

Emitter electrode 41 is connected to at least one of third layer 23 and channel layer 31 and separated from gate layer 32. In FIG. 1, emitter electrode 41 is connected to channel layer 31. Emitter electrode 41 is an ohmic electrode.

Collector electrode 42 is provided on back surface P2 of collector layer 19. Collector electrode 42 is an ohmic electrode.

Next, an exemplary method for using semiconductor device 90 will be described. Semiconductor device 90 is used as a switching device controlling electrical conduction between emitter electrode 41 and collector electrode 42. Emitter electrode 41 is used as a negative electrode, and collector electrode 42 is used as a positive electrode. Semiconductor device 90 includes switching element 80 having channel CH controlled for switching, that is, ON/OFF operation. Channel CH is a portion of channel layer 31 sandwiched between gate layer 32 and a portion of side wall SW formed of second layer 22.

When a depletion layer is sufficiently formed in channel CH by applying an electric field to channel CH, switching element 80 attains an OFF state. To that end, a potential that causes carriers in channel CH to be sufficiently forced away is applied to gate layer 32 via gate electrode 40. In the present embodiment, a negative potential having a sufficiently high absolute value is applied. In contrast, when such a potential is not applied, carriers are present in channel CH, and thus switching element 80 is in an ON state. It is noted that, in an ON state, pair annihilation occurs in first layer 21 between electrons as the carriers in channel CH having n type (the second conductivity type) and holes injected from the collector layer. By changing the potential to be applied to gate electrode 40 as described above, switching element 80 is switched, and thus semiconductor device 90 is switched.

Next, as a method for manufacturing semiconductor device 90 will be described below.

Figure 4:
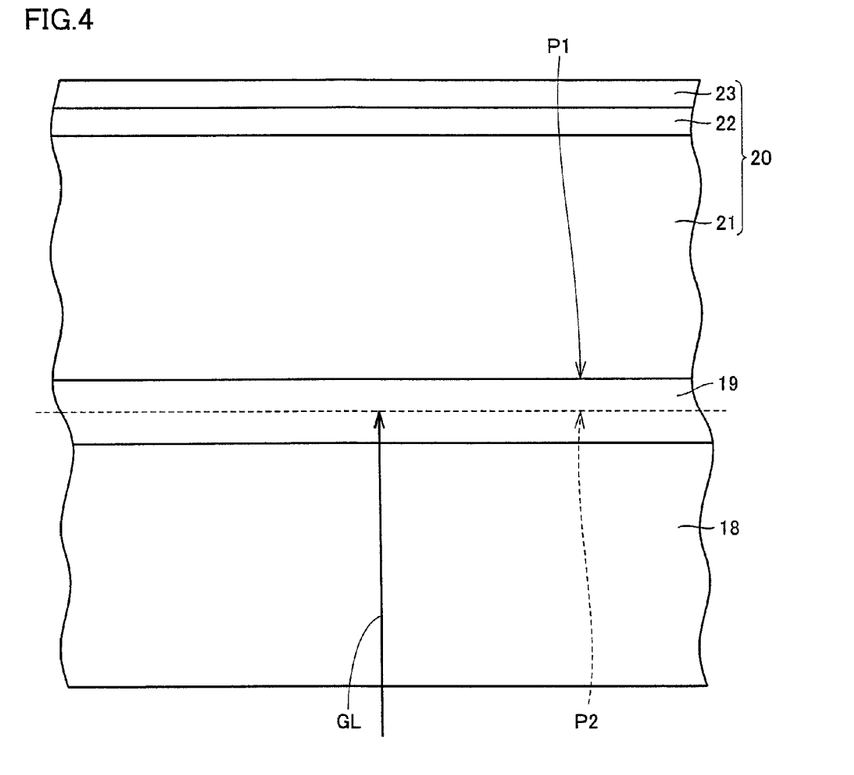
FIG. 4 is a cross sectional view schematically showing a first step of a method for manufacturing the silicon carbide semiconductor device in Embodiment 1 of the present invention.
Figure 5:
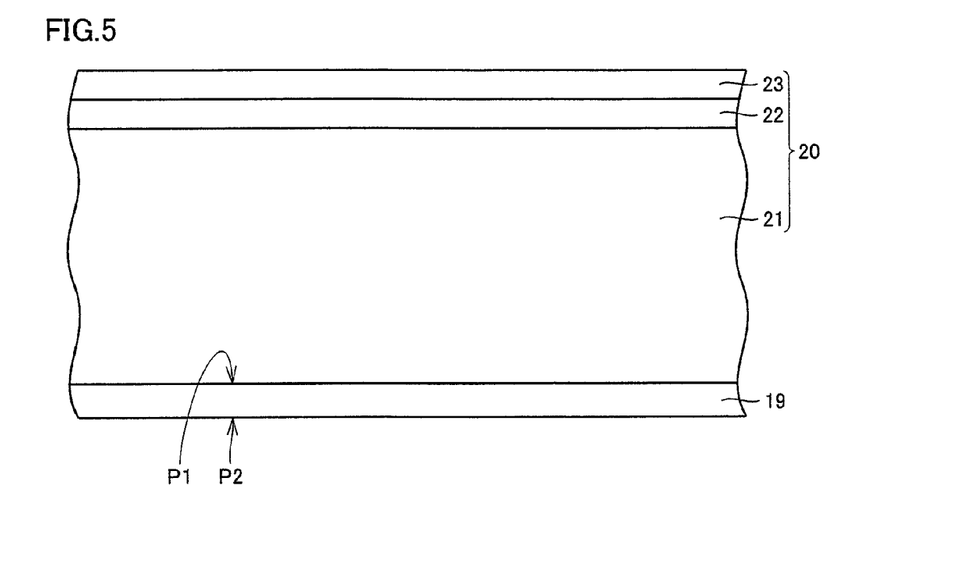
FIG. 5 is a cross sectional view schematically showing a second step of the method for manufacturing the silicon carbide semiconductor device in Embodiment 1 of the present invention.

As shown in FIG. 4, collector layer 19, first layer 21, second layer 22, and third layer 23 are formed in order on a silicon carbide single crystal substrate 18. This formation can be performed by, for example, CVD (Chemical Vapor Deposition). Silicon carbide single crystal substrate 18 has, for example, n type conductivity. Then, silicon carbide single crystal substrate 18 is removed by, for example, back grinding (an arrow GL in FIG. 4) (FIG. 5).

Figure 6:
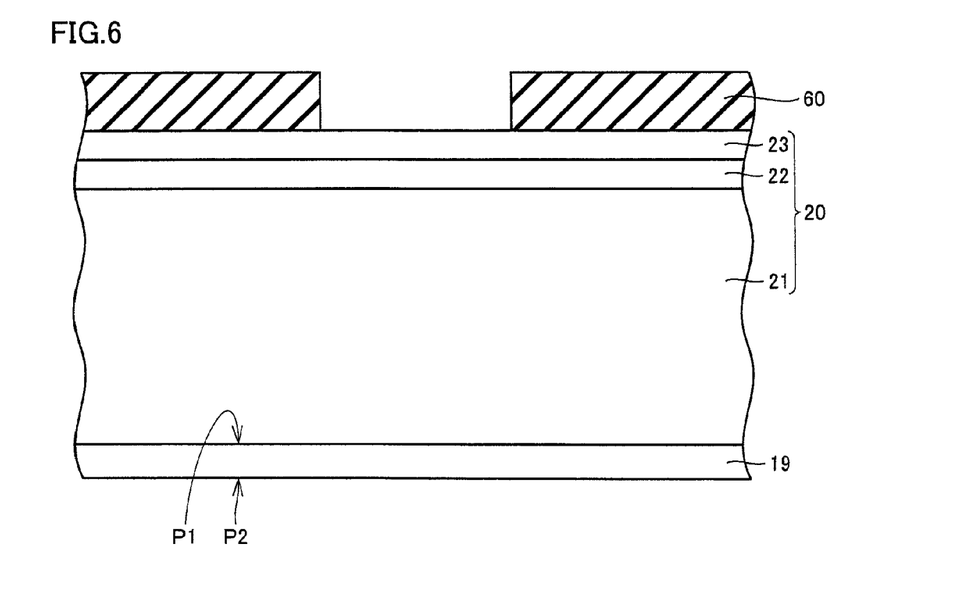
FIG. 6 is a cross sectional view schematically showing a third step of the method for manufacturing the silicon carbide semiconductor device in Embodiment 1 of the present invention.
Figure 7:
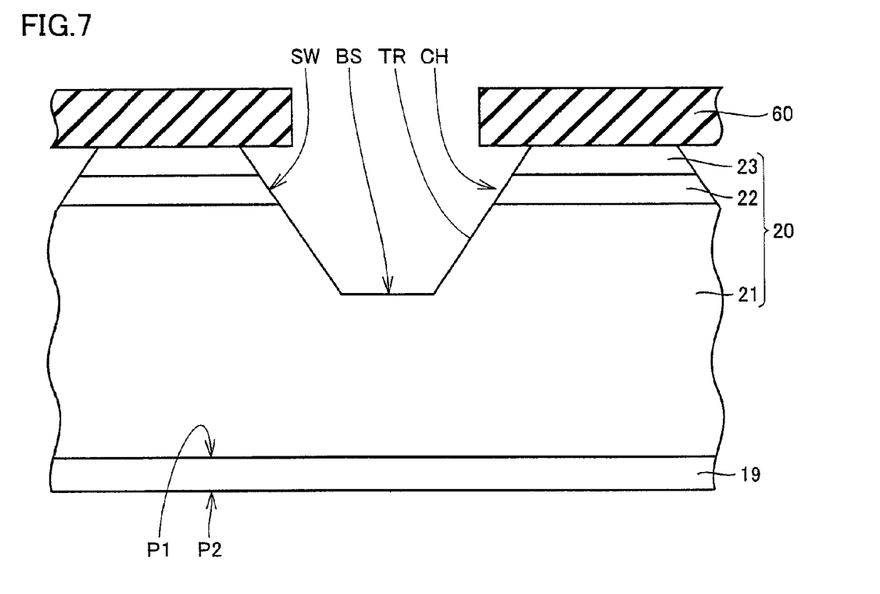
FIG. 7 is a cross sectional view schematically showing a fourth step of the method for manufacturing the silicon carbide semiconductor device in Embodiment 1 of the present invention.

As shown in FIG. 6, a mask layer 60 having an opening is formed. The position of the opening corresponds to a position where trench TR (FIG. 1) is to be formed. The material for mask layer 60 is, for example, silicon oxide. Subsequently, etching using mask layer 60 as a mask is performed. The etching is performed by, for example, thermal etching (described in detail later). By the etching, trench TR is formed (FIG. 7). Then, mask layer 60 is removed.

Figure 8:
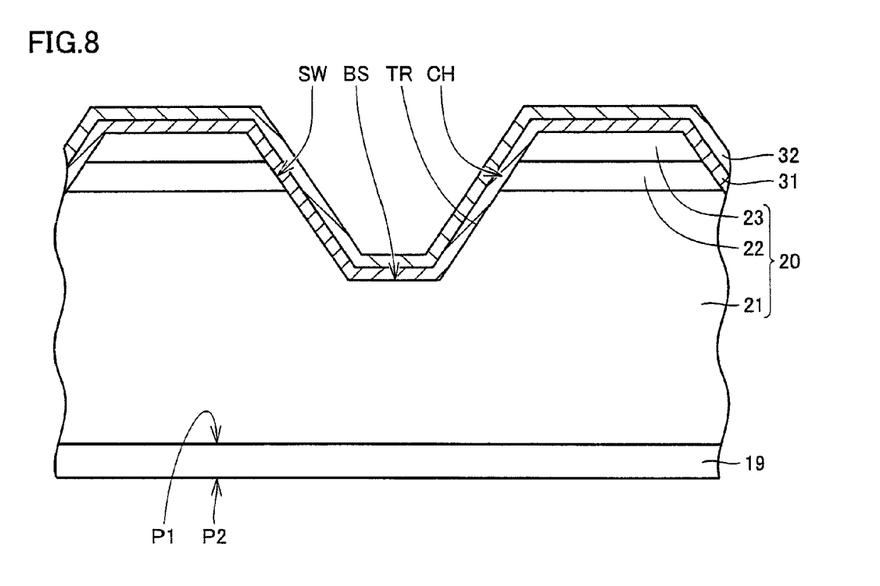
FIG. 8 is a cross sectional view schematically showing a fifth step of the method for manufacturing the silicon carbide semiconductor device in Embodiment 1 of the present invention.

As shown in FIG. 8, channel layer 31 is formed on side walls SW and bottom surface BS of trench TR. Subsequently, film formation is performed on channel layer 31, and thus gate layer 32 sandwiching channel layer 31 between itself and side walls SW is formed. Channel layer 31 and gate layer 32 can be formed by, for example, CVD.

Figure 9:
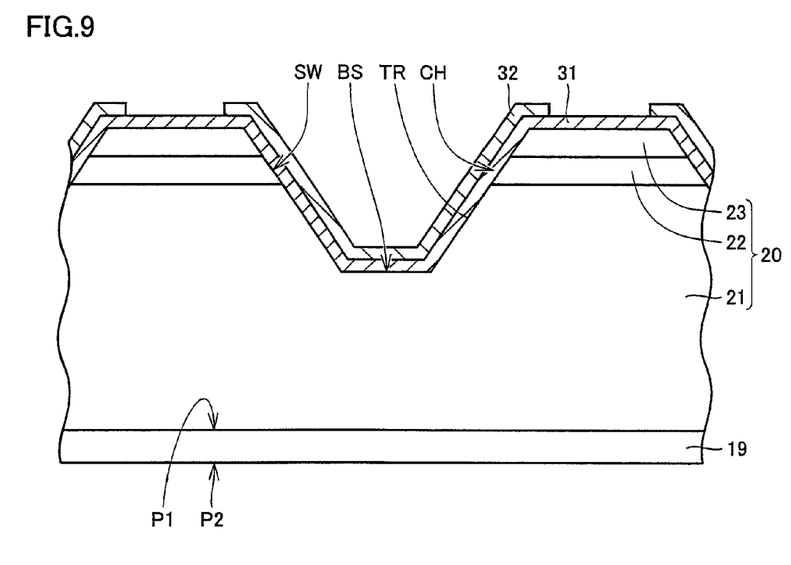
FIG. 9 is a cross sectional view schematically showing a sixth step of the method for manufacturing the silicon carbide semiconductor device in Embodiment 1 of the present invention.

As shown in FIG. 9, gate layer 32 is patterned and thus channel layer 31 is exposed. Referring to FIG. 1 again, gate electrode 40 contacting gate layer 32 is formed. Further, emitter electrode 41 separated from gate layer 32 and contacting channel layer 31 is formed. Furthermore, collector electrode 42 is formed on back surface P2 of collector layer 19. Consequently, semiconductor device 90 is obtained.

Next, the "thermal etching" described above will be described. The thermal etching is performed by exposing an object to be etched to an etching gas under high temperature, and substantially does not have a physical etching action. By using the thermal etching, crystallographically-specific side wall SW can be spontaneously formed. Preferably, process gas for the thermal etching contains halogen atoms, and more preferably, the halogen atoms are chlorine atoms. Specifically, the process gas may be $Cl_2$ gas. Preferably, the process gas further includes a gas containing oxygen atoms, in addition to a gas containing a halogen element. The gas containing oxygen atoms may specifically be $O_2$ gas. It is noted that the process gas may contain a carrier gas. As the carrier gas, for example, $N_2$ gas, Ar gas, or He gas can be used. The thermal etching is preferably performed at a thermal treatment temperature of not less than 700° C. and not more than 1200° C. The lower limit of the temperature is more preferably 800° C., further preferably 900° C. The upper limit of the temperature is more preferably 1100° C., further preferably 1000° C. In this case, the etching rate can have a sufficiently practical value. When the thermal treatment temperature is set to not less than 700° C. and not more than 1000° C., the rate of etching silicon carbide is, for example, about 70 μm/hour.

It is noted that the etching for forming trench TR is not limited to the thermal etching, and another dry etching method may be used. For example, dry etching such as reactive ion etching or ion beam etching may be used. Further, wet etching may be used instead of dry etching.

According to semiconductor device 90 in the present embodiment, a high-speed operation can be performed by using switching element 80 having n type, that is, a unipolar element. Further, since junction gate 32 is used instead of an insulating gate in switching element 80, channel mobility close to theoretical channel mobility of SiC can be readily utilized. Thereby, ON resistance of switching element 80 can be readily reduced to a certain degree. To switching element 80 having n type as described above, collector layer 19 having p type is added. That is, switching element 80 as a unipolar element is combined with a bipolar transistor. Thereby, semiconductor device 90 capable of performing a high-speed operation and having a low ON resistance and a high breakdown voltage can be obtained. Furthermore, switching element 80 used for semiconductor device 90 has a configuration easy to manufacture.

Further, channel layer 31 of switching element 80 has n type conductivity (the second conductivity type). Thereby, the ON resistance of switching element 80 can be reduced. Thus, ON resistance of semiconductor device 90 can be further reduced.

Further, trench TR has a tapered shape. Thereby, channel layer 31 can be readily formed on side wall SW of trench TR.

Further, semiconductor device 90 has emitter electrode 41 connected to at least one of third layer 23 and channel layer 31 and separated from gate layer 32. Thereby, carriers can be supplied from emitter electrode 41 into switching element 80.

Embodiment 2

Figure 10:
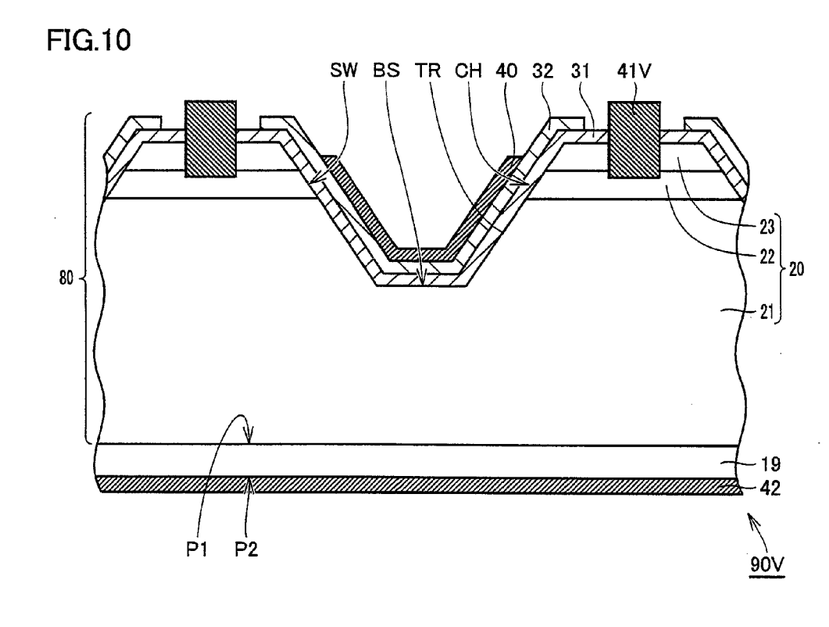
FIG. 10 is a cross sectional view schematically showing a configuration of a silicon carbide semiconductor device in Embodiment 2 of the present invention.

As shown in FIG. 10, a semiconductor device 90V in the present embodiment has an emitter electrode 41V instead of emitter electrode 41 in Embodiment 1. Emitter electrode 41V penetrates third layer 23 and is connected to second layer 22. Thereby, a potential of second layer 22 can correspond to a potential of emitter electrode 41V.

Although trench TR in each of the above embodiments has substantially flat bottom surface BS (FIGS. 1 and 10), the configuration of the trench is not limited thereto. For example, a V-shaped trench substantially having no bottom surface may be used.

Further, although trench TR has a net-like shape as a combination of hexagonal shapes (FIG. 3), the configuration of the trench is not limited thereto. For example, a net-like shape as a combination of rectangular shapes (including square shapes) may be used.

Further, although emitter electrode 41 is connected to channel layer 31 in FIG. 1, the configuration of the emitter electrode is not limited thereto. For example, the emitter electrode may be connected to third layer 23. In this case, the emitter electrode is electrically connected to channel layer 31 via third layer 23.

Further, although trench TR has a tapered shape (FIG. 1), the configuration of the trench is not limited thereto. For example, the side wall of the trench may extend along a thickness direction (corresponding to a vertical direction in FIG. 1).

Further, although the first conductivity type is p type and the second conductivity type is n type in the above description, the first conductivity type may be n type and the second conductivity type may be p type.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device, comprising:
   a collector layer made of silicon carbide having a first conductivity type; and
   a switching element provided on said collector layer, said switching element including a junction gate for controlling a channel having a second conductivity type different from said first conductivity type;
   wherein said switching element includes:
      a semiconductor layer having a first layer provided on said collector layer and having said second conductivity type, a second layer provided on said first layer and having said first conductivity type, and a third layer provided on said second layer and having said second conductivity type, said semiconductor layer being provided with a trench having a side wall penetrating said third layer and said second layer and reaching said first layer;
      a channel layer contacting each of said first to third layers on said side wall of said trench and having said second conductivity type;
      a gate layer as said junction gate, sandwiching said channel layer between itself and said second layer and having said first conductivity type; and
      a gate electrode provided on said gate layer.

2. The silicon carbide semiconductor device according to claim 1, wherein said second conductivity type is n type.

3. The silicon carbide semiconductor device according to claim 1, wherein said trench has a tapered shape.

4. The silicon carbide semiconductor device according to claim 1, further comprising an emitter electrode connected to at least one of said third layer and said channel layer and separated from said gate layer.

5. The silicon carbide semiconductor device according to claim 4, wherein said emitter electrode is connected to said second layer.

* * * * *